United States Patent [19]

Rhee

[11] Patent Number: 5,420,821
[45] Date of Patent: May 30, 1995

[54] DECODER FOR SALVAGING DEFECTIVE MEMORY CELLS

[75] Inventor: Tetsuyuki Rhee, Ibaraki, Japan

[73] Assignee: Texas Instruments Incorporated, Dallas, Tex.

[21] Appl. No.: 132,605

[22] Filed: Oct. 6, 1993

[30] Foreign Application Priority Data

Oct. 6, 1992 [JP] Japan .................................. 4-292093

[51] Int. Cl.[6] .............................................. G11C 7/00
[52] U.S. Cl. ................... 365/200; 365/203; 365/204; 365/225.7
[58] Field of Search ...................... 365/200, 225.7, 203, 365/204

[56] References Cited

U.S. PATENT DOCUMENTS

| | | | |
|---|---|---|---|
| 4,441,170 | 4/1984 | Folmsbee et al. | 365/200 |
| 4,571,707 | 2/1986 | Watanabe | 365/200 |
| 4,592,024 | 5/1986 | Sakai et al. | 365/200 |
| 4,803,656 | 2/1988 | Takemae | 385/200 |
| 4,975,881 | 12/1990 | Kagami | 365/200 |

Primary Examiner—Joseph A. Popek
Assistant Examiner—Son Dinh
Attorney, Agent, or Firm—Dana L. Burton; James C. Kesterson; Richard Donaldson

[57] ABSTRACT

A high-speed decoder for salvaging defective memory cells which has voltage generators VG0 and VG3 for generating voltages having binary logic levels corresponding to the bit information of each column of the addresses of defective memory cells. Upon input of a memory address signal, the voltage level of the bits of each column of the address signal are checked against the voltage levels corresponding to each column from the voltage generator. When all of the columns agree, an address agreement signal is generated by an address corroboration circuit including exclusive OR gates EX0 to EX3 and a NAND gate 10. The output terminals QE0 to QE3 of the voltage generators VG0 to VG3 are connected to the input terminals of the exclusive OR gates EX0 to EX3, and the address input terminals IN0 to IN3 are connected to the other input terminals of the exclusive OR gates EX0 to EX3, and the output terminals of the exclusive OR gates EX0 to EX3 are connected to the input terminal of the NAND gate 10, and the output terminal of the NAND gate 10 is connected to the input terminal of the NAND gate 12 via an inverter 14, and the output terminal QEa of the voltage generator VGa is connected to the other input terminal of the NAND gate 12 via an inverter 15. The fuses F0 to F3 of the voltage generators VG0 to VG3 are selectively burnt in accordance with the value of the set address, and the fuse Fa of the voltage generator VGa is burnt when the optional address is set.

7 Claims, 5 Drawing Sheets

DECODER FOR SALVAGING DEFECTIVE MEMORY CELLS

The present invention concerns a decoder for redundant memory array circuits.

BACKGROUND OF THE INVENTION

In general, with semiconductor memory devices such as DRAMs and field memory devices, a number of redundant rows or columns are included in the normal memory, and are provided in order to replace defective (bad) memory cells in the normal memory array or the rows or columns that contain these defective memory cells.

Figure 4:
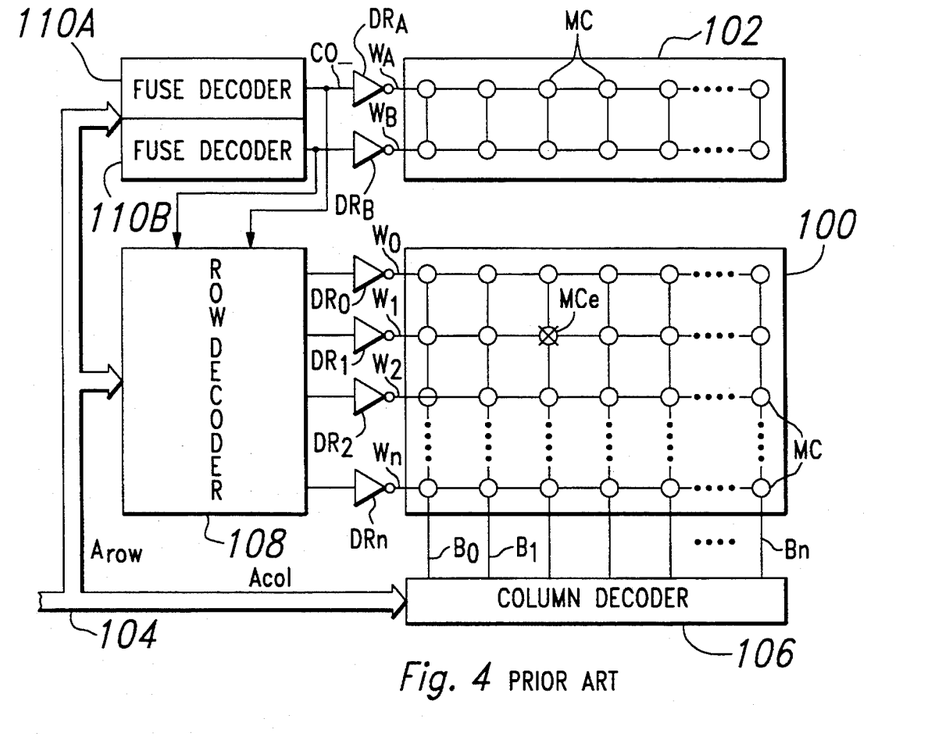
FIG. 4 is a block diagram showing the circuit configuration for a typical redundant circuit.

FIG. 4 shows a configuration for a typical redundant circuit. In this memory circuit, the normal memory array 100 composed of memory cells MC arranged in numerous specific columns and rows is equipped with a redundant memory array 102 consisting of, for example, 2 rows of memory cells MC. Of the memory addresses input via the address base 104, the column address Acol is transmitted to the column decoder 106, and the row address Arow is transmitted to the row decoder 108, and also to the fuse decoders 110A and 110B. When a defective memory cell MCe is present, for example, in the second row of the normal memory array 100, the address of the second column is programmed into the fuse decoder 110A. When a defective memory cell is also present in another row of the normal memory array 100, the address of this other row is programmed into the fuse decoder 110B.

When the output row address Arow indicates the second row of the normal array 100, an L level address agreement signal CO- is generated by the fuse decoder 110A. When this agreement signal CO- is generated, the word line WA of the row in the redundant memory array 102 corresponding to the fuse decoder 110A is driven by the driver DRA, and the row decoder 108 is disenabled. The column decoder 106 decodes the column address Acol as usual, and the bit line Bi indicated by the column address Acol is selected.

In this manner, when the address of a row containing defective memory cells MCe in the legitimate memory array 100 (for example, the second row) is indicated, the memory of a special row in the memory array 102 is accessed instead of the row (2nd row) in the legitimate memory array 100 because the fuse decoder (for example 110A) in which the address of this row has been programmed generates an address agreement signal CO-.

Figure 5:
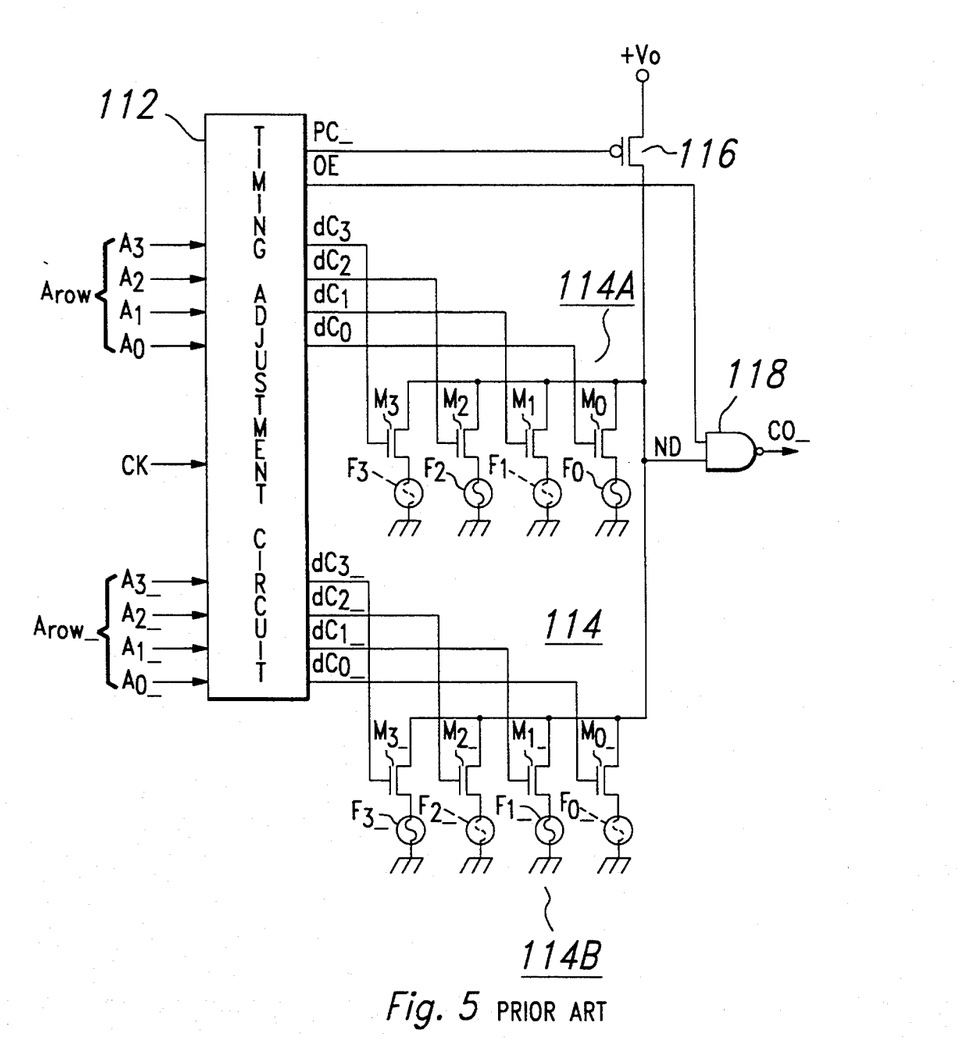
FIG. 5 is a circuit diagram showing the circuit configuration for a conventional fuse decoder.

FIG. 5 shows a circuit configuration diagram of a conventional fuse decoder. This fuse decoder consists of a timing adjustment circuit 112, a decoding element 114, a precharge p-type MOSFET 116 and an output timing adjustment NAND gate 118.

The decoding part 114 consists of first and second decoding parts 114A and 114B, where both decoding parts 114A and 114B are composed of n-type MOSFETs M0 to M3 and M0- to M3- and numerous fuses (4) F0 to F3 and F0- to F3- corresponding to the bit number (for purposes of explanation, 4 bits) of the respective row address signals Arow. When, for example, a defective memory cell MCe is present on the tenth row of the normal memory array 100, and this 10th row (binary number 1010) is programmed into the decoder, the fuses F1 and F3 of the second and fourth rows are burnt at the first decoding part 114A, and the fuses F0- and F2- of the first and third rows are burnt at the second decoder part 114B that has been complemented.

Figure 6:
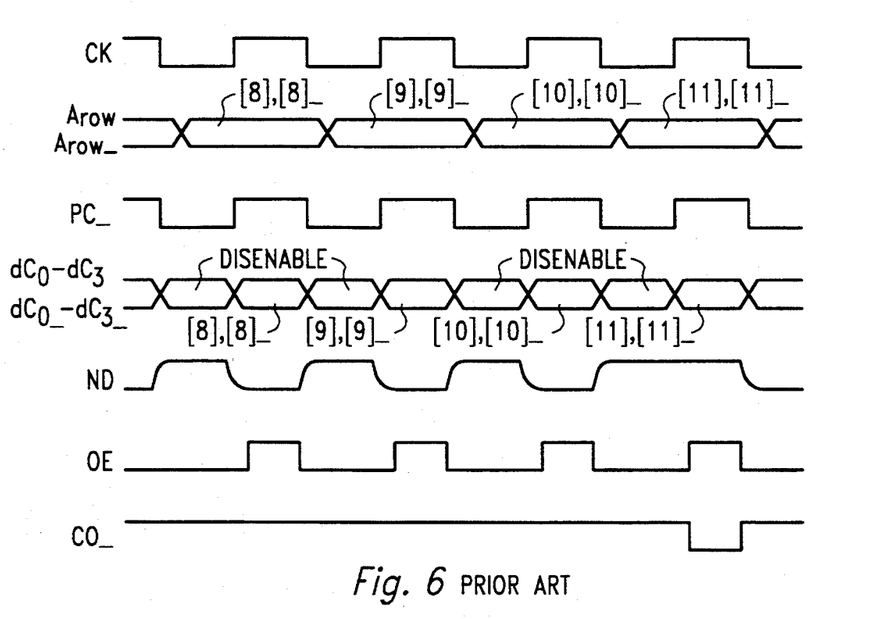
FIG. 6 is a timing diagram pertaining to the voltage or signal of each part used to explain the operation of a conventional fuse decoder, such as is shown in FIG. 5.

The operation of this fuse decoder is explained below in reference to FIG. 6. The timing adjustment circuit 112 inputs a row address Arow A0 to A3 and a complemented row address Arow- A0- to A3-, and synchronization occurs with respect to the system clock CK. Special control signals dc0 to dc3, dc0- to dc3-, PC- and OE are output to each part 114A, 114B, 116 and 118 according to the timing described below.

During the time when the system clock CK is at the L level, the discharge control signals dc0 to dc3 and dc0- to dc3- assume a disenabled or high impedance state corresponding to the first and second decoding parts 114A and 114B, and simultaneous thereto, the precharge control signal PC- reaches the gate terminal of the p-type MOSFET 116, this MOSFET 116 goes on, and a node ND precharges to level H. During this time, an address signal Arow A0–A3 and a complemented row address signal Arow- A0- to A3- are input to the timing control circuit 112.

Next, when the system clock CK is on the H level, with regard to the timing adjustment circuit 112, the p-type MOSFET 116 goes on, and meanwhile, the discharge control signal dc0 to dc3 corresponding to the address signal Arow A0 to A3 reaches the gate terminal of the n-type MOSFETs M0-M3 of the first decoding part 114A, and simultaneously, the discharge control signal dc0- to dc3- corresponding to the complemented address signal Arow- A0- to A3- reaches the gate terminal of the n-type MOSFETs M0- to M3- of the second decoding part 114B.

For example, when the address signal Arow indicates the 9th row, bits A3, A2, A1 and A0 are (1, 0, 0, 1), and thus the bits dc3, dc2, dc1, dc0 of the discharge control signal corresponding to the first decoding part 114A are (1, 0, 0, 1), and the bits de3-, dc2-, dc1-, dc0- of the discharge control signal with respect to the second decoding part 114B are (0, 1, 1, 0). Thus, the first and third of the n-type MOSFETs M0 and M3 go on at the first decoding part 114A, but the fuse F3 alone of the third column is cut, and thus only the fuse F0 of the first column is on. In addition, at the second decoding part 114B, the n-type MOSFETs M1- and M2- of the second and fourth columns go on, but the fuse F2- of the third column is cut, and thus only the fuse F1- of the second column is on. As a result, the voltage (H level) that had been precharged at the node ND discharges by way of the discharge circuit of the fuse F1- and the n-type MOSFET M1- of the second column pertaining to the second decoding part 114B and the discharge circuit of the fuse F0 and the n-type MOSFET M0 of the first column pertaining to the first decoding part 114A, and the node ND assumes the L level. On the other hand, the output enable signal OE reaches the NAND gate 118 from the timing control circuit 112, but at this time, the voltage level of the node ND is at the L level and the output discharge voltage of the NAND gate 118 is at the H level.

However, when the address signal Arow indicates the address (10th row) that is programmed into the fuse decoder, the bits dc3, dc2, dc1, dc0 of the discharge control signal that reaches the first decoding part 114A from the timing control circuit 112 are (1, 0, 1, 0), and the bits dc3-, dc2-, dc1-, dc0- of the discharge control signal that reaches the second decoding part 114B are thus (0, 1, 0, 1). In this case, the n-type MOSFETs M1 and M3 of the 2nd and 4th columns go on at the first decoding part 114A, and the fuses F1 and F3 are both cut. Although the n-type MOSFETs M0- and M2- of the first and third columns go on at the second decoding part 114B, both of the fuses F0- and F2- are cut. Consequently, the node ND does not discharge, and the H level voltage obtained in the precharge is maintained. As a result, when the output enable signal OE reaches the NAND gate 118, the L level voltage signal produced by inversion of the voltage level (H level) of the node ND is generated as an address agreement signal CO- from the output terminal of the NAND gate 118.

As described above, in the first half of the system clock cycle with conventional fuse decoders, the node ND is precharged to the H level, and then in the second half of the system clock cycle, the address signal Arow and the complemented address signal Arow- that are input to the first and second decoding parts 114A and 114B are read or identified, and the node ND is selectively discharged depending on the results of the read, whereupon an address agreement signal CO- is generated when no discharge occurs at the node ND. In this manner, because the period when the node is precharged is set in each system clock cycle, timing adjustment for each part of the decoder is difficult when the period of the address signal or the period of the memory access is short. In addition, when the value of the input address signal is near that of the set address, for example, when they differ only by one, the node must be discharged with just one of the fuses, which causes problems in terms of the reliability of the discharge circuit. In addition, the voltage level of the node ND changes depending on fluctuations in the discharge characteristics or precharge characteristics, and there is the danger that erroneous discharge signals might be output from the AND gate 118.

In addition, with the aforementioned conventional fuse decoders, not only is there a decoding section 114A for the address signal Arow, but there is also a decoding part 114B for the complemented address signal Arow-, and thus two times the number of fuses F0 to F3 and F0- to F3- are present relative to the bit number of the address signal. Coding relative to the complemented address signal Arow- is carried out because the bit information of the input address signal cannot be confirmed at the columns where the fuses have been cut. For example, at the second and fourth columns of the first decoding part 114A, the fuses F1 and F3 are cut, and thus it does not matter whether the n-type MOSFETs M1 and M3 are on or off. A discharge circuit is not formed, and thus the bit information (0 or 1) of the first and fourth columns of the input address signal Arow cannot be identified. Rather, in the second decoder part 114B where the logic of the first decoder part 114A is inverted, the first and fourth column fuses F0- and F3- are not cut, and thus the first and fourth column bit information (0 or 1) of the complemented address signal Arow- can be identified.

Although functional assurance is provided in this manner, the establishment of a double set of deciding parts or fuses is a significant disadvantage in terms of reliability and integration. If the bit number of the discharge control and address signals increases by a factor of two, the wiring width also increases by a factor of two which decreases the level of integration. In addition, the fuses are generally physically burnt using a laser, and there is a yield with this process as well. Thus, the yield decreases as the number of fuses increases. In addition, the surface area taken by the fuses is large, and the surface area of the redundant circuit increases as the number of fuses increases, which causes problems with chip surface area.

In addition, as described above, the action of each part is finely timed, and thus the reliability of the timing adjustment circuit 112 not only greatly affects the reliability of the decoder, but also takes a corresponding circuit surface area in the decoder.

In addition, for example, with field memories, when a memory access is carried out a synchronously between the read side and the write side, the decoding operation can function only with respect to a single input address at a time in the aforementioned conventional fuse decoders, and thus the respective fuse decoders of the read and write side must be ready.

SUMMARY OF THE INVENTION

In accordance with the present invention, a decoder is provided for salvaging defective memory cells whereby, in order to substitute a memory cell in a redundant memory array for a defective memory cell in a normal memory array, a response is made to the memory address signal, and when the address indicated by the memory address signal agrees with the address of the aforementioned defective memory cell, an address agreement signal is generated. In the latter respect, the decoder for salvaging defective memory cells includes a voltage generation means for generating the voltages having binary logic levels corresponding to the bit information of each column of the addresses of the aforementioned defective memory cells and an address corroboration means whereby the aforementioned voltage levels from the aforementioned voltage generation means are corroborated with the input voltage levels of the bits comprising the aforementioned memory address signal for each column, and the aforementioned address agreement signal is generated when the two agree.

When the bit information of each column of the defective memory cell address has been established, the voltages having binary logic levels corresponding to the bit information of each column are transmitted to the address corroboration means from the voltage generation means. When the memory address signal is thus input, the voltage level of the bits of each column of the address signal are checked against the voltage levels corresponding to each column from the voltage generation means, and when all of the columns agree, an address agreement signal is generated by the address corroboration means.

In reference numerals and symbols as shown in the drawings:

| | |
|---|---|
| 10, 12 | NAND gate |
| 14, 15 | inversion circuit |
| 16 | precharge control terminal |
| 18 | discharge control terminal |
| VG0 to VG3, VGa | voltage generators |
| F0 to F3, Fa | fuses |
| ND0 to ND3 | nodes |
| NM0 to NM3, NMa | n-type MOS transfer gates |
| PM0 to PM3, PMa | n-type MOS transfer gates |
| IV0 to IV3, IVa | inversion circuits |
| EX0 to EX3, EXa | exclusive OR gates |

DESCRIPTION OF PREFERRED EMBODIMENT

Figure 1:
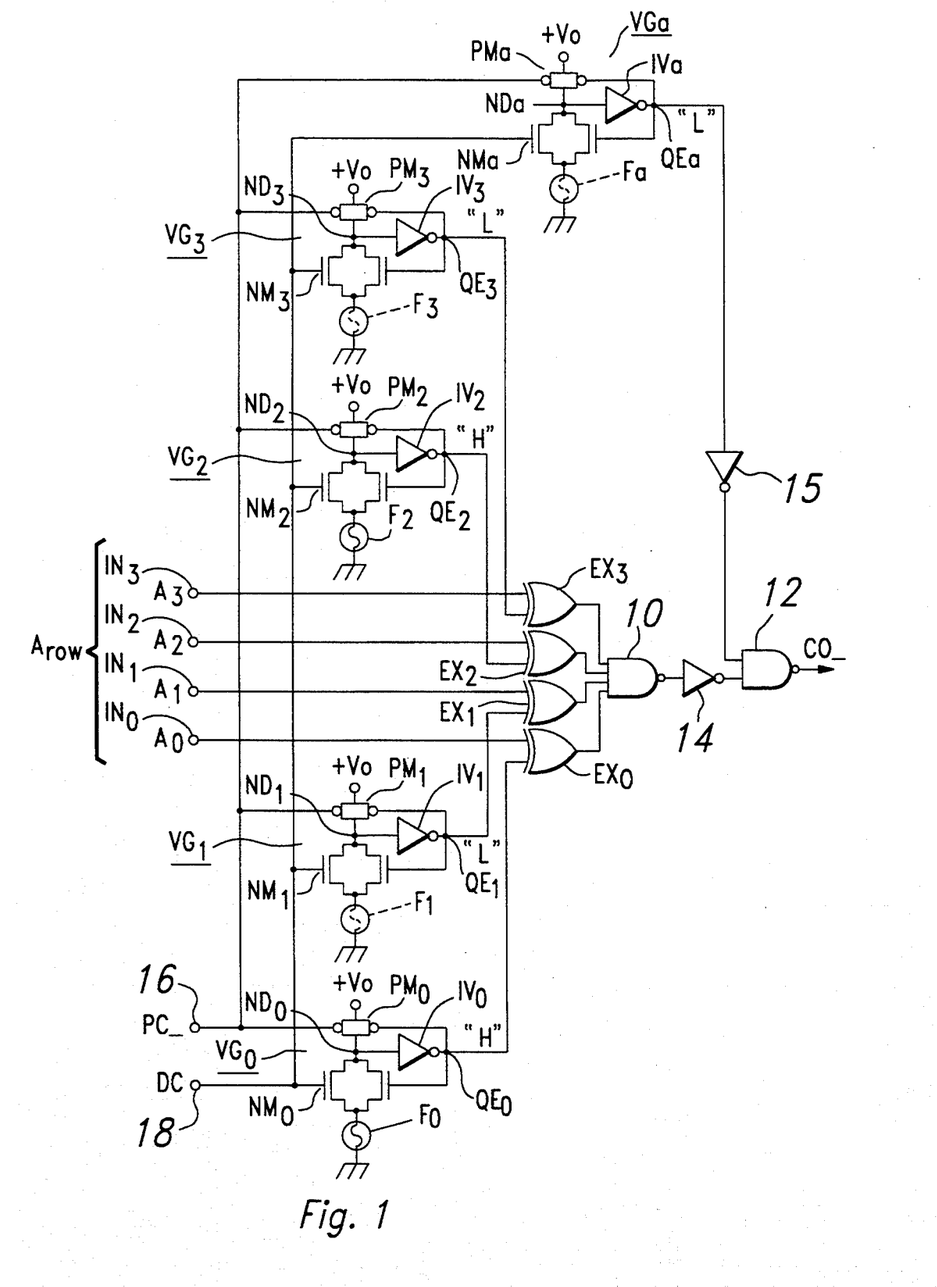
FIG. 1 is a circuit diagram showing the circuit structure of a fuse decoder for salvaging defective memory cells as constructed in accordance with the present invention.

FIG. 1 is a circuit configuration of a fuse decoder which is used as a defective memory salvaging decoder according to an embodiment of the present invention. This fuse decoder comprises voltage generators VG0–VG3, VGa of a number that is just one greater (5) than the number of bits of the row address signal Arow which serves as the input address signal (for explanatory purposes, this number is taken to be 4 bits), exclusive OR gates EX0 to EX3 of a number that is the same as that of the bit number of the row address signal Arow, two NAND gates 10 and 12, along with two inverters 14 and 15.

In each voltage generator VGi, a p-type MOS transfer gate PMi, an n-type MOS transfer gate NMi and a fuse Fi are connected in series between the H level voltage source terminal (+V0) and the ground potential, and the node NDi between the p-type MOS transfer gate PMi and the n-type MOS transfer gate NMi is connected to the input terminal of the inverter IVi, with the output terminal QEi of the inverter IVi being connected to one of the gate terminals of the n-type MOS transfer gate NMi and the p-type MOS transfer gate PMi. The precharge control terminal and the discharge control terminal 18 are connected respectively to the other gate terminals of the p-type MOS transfer gate PMi and the n-type MOS transfer gate NMi.

The output terminals QE0–QE3 of the voltage generators VG0 to VG3 are connected respectively to one of the input terminals of the exclusive OR gates EX0 to EX3. The address input terminals IN0 to IN3 are respectively connected to the other input terminals of the exclusive OR gates EX0 to EX3. The output terminals of the exclusive OR gates EX0 to EX3 are connected respectively to the input terminals of the 4-input NAND gate 10, and the output terminal of the 4-input NAND gate 10 is connected to one of the input terminals of the NAND gate 12 via the inverter 14. The output terminal QEa of the voltage generator VGa is connected to the other input terminal of the NAND gate 12 via the inverter 15.

One address for identification is set (programmed) into the fuses F0 to F3 of the voltage generators VG0 to VG3 in this fuse decoder. For example, if a defective memory is present in the 10th row of the normal memory array, the address of this 10th row (in binary form, "1010") is programmed into the fuse decoder, and the fuses F1 and F3 in the second and fourth voltage generators VG1 and VG3 are burnt, and the fuses F2 and F4 in the first and third voltage generators VG0 and VG2 are not burnt.

When an address is set to the fuses F0 to F3 in the manner described above, once the voltage source is applied to the system, voltages having binary logic levels are generated from the voltage generators VG0 to VG3 according to the bit information of each column of the set address; specifically, the state (burnt or not burnt) of each fuse F0 to F3.

Figure 2:
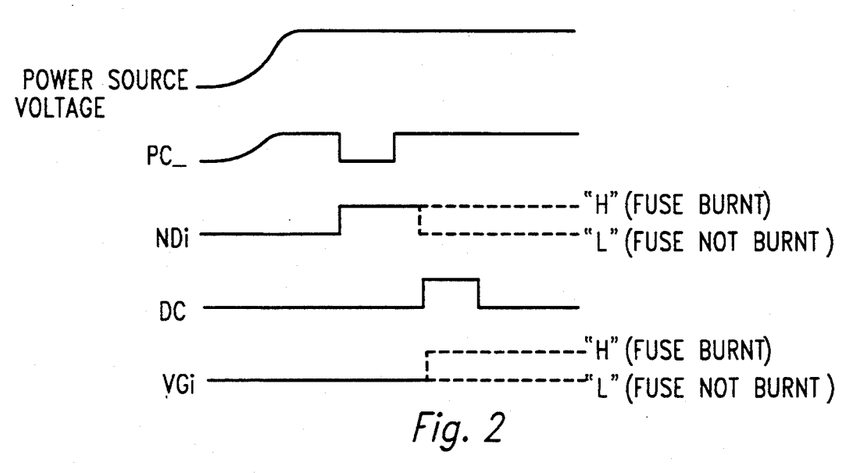
FIG. 2 is a timing diagram pertaining to each voltage used for explaining the operation of the voltage generators of the fuse decoder shown in FIG. 1.

The operation of the voltage generators VG0–VG3 will now be explained in reference to the timing diagram of FIG. 2. When the voltage generation source starts up, first, an L-level precharge control signal PC- is input to the precharge control terminal 16. This precharge control signal PC- can be formed in the memory control circuit, or may originate externally. When the precharge control signal PC- is applied, the p-type MOS transfer gate PMi in each voltage generator VGI goes on, and the node NDi is charged to the H-level voltage by the V0+ power source voltage via the gate PMi. Next, an H-level discharge control signal DC is input into the discharge control terminal 16. This discharge control signal DC as well can originate in the memory control system or can originate externally. When this discharge control signal DC is applied, the n-type MOS transfer gate NMi in each voltage generator VGi goes on.

Consequently, when the fuse Fi is not burnt, the node NDi is discharged to the L level voltage via the gate NMi and the fuse Fi. When the node NDi goes to the L voltage level, the output terminal QEi of the inverter IVi goes to the H level. When this output terminal QEi goes to the H level, the discharge control signal DC is cut, whereupon the ON state of the n-type MOS transfer gate NMi and the ON state of the p-type MOS transfer gate PMi are maintained, and by this means, the voltage (L level) of the node NDi and the voltage (H level) of the output terminal QEi are latched.

However, although the n-type MOS transfer gate NMi goes on due to the discharge control signal DC, when the fuse Fi is burnt, a discharge circuit is not formed, and thus the node NDi is maintained at the H level voltage. With the node NDi at the H level voltage, the output terminal QEi of the inverter IVi is at the L level. With the output terminal QEi at the L level, after the discharge control signal DC is cut, the n-type MOS transfer gate NMi assumes an ON state, and the p-type MOS transfer gate PMi assumes an ON state. By this means, the voltage (H level) of the node NDi and the voltage (L level) of the output terminal QEi are latched.

In this manner, when the power source is applied to the system, the output voltage QEi is generated at the L level from the voltage generator VGi when the fuse Fi has been burnt, and is generated at the H level when the fuse Fi has not been burnt. In the example shown in FIG. 1, the address ("1010") is programmed, and thus the fuses Fi at the second and fourth voltage generators VG1 and VG3 have been burnt, and the fuses Fi at the first and third voltage generators VG0 and VG2 have not been burnt. Consequently, L level voltages are respectively generated from the output terminals QE1 and QE3 of the voltage generators VG1 and VG3 of the second and fourth columns, and H level voltages are generated from the output terminals QE0 and QE2 of the voltage generators VG0 and VG2 of the first and third columns. Thus, from all of the first through fourth voltage generators VG0–VG3, the bits of the column with the set address ("1010") are inverted and the four bit address ("0101") is generated.

The fuse Fa of the voltage generator VGa is burnt when the optional address is set (programmed) into the fuse decoder. This voltage generator VGa has the same action as the aforementioned first through fourth voltage generators VG0 to VG3 with respect to the precharge control signal PC- and the discharge control signal DC. Consequently, as shown in FIG. 1, when the address ("1010") is set in the fuses F0 to F3, the fuse Fa is burnt, and voltage level L is generated from the output terminal QEa of the voltage generator VGa. Thus, the H level voltage passes through the inverter 15 and reaches the NAND gate 12 as an enable signal. In this manner, when the fuse Fa of the voltage generator VGa is burnt, the NAND gate 12 is enabled, and the output voltage of the NAND gate 12 is thus determined by the logical product of the output voltages of the exclusive OR gates EX0 to EX3 or the output voltages of the NAND gate 10.

The address that has a special meaning to the function of this voltage generator VGa is the address ("0000"). Specifically, when the fuses F0 to F3 all are not burnt, no distinction is made whether or not the address ("0000") is programmed or not programmed into the fuse decoder. Consequently, when the voltage generator VGa is not set and no other address is set, the input address signal Arow indicates the address ("0000"), and thus the address agreement signal CO- is generated, which is undesirable. In this regard, when no address is set in the fuse decoder, the fuse Fa is not burnt, and an H level voltage is generated from the output terminal QEa of the voltage generator VGa, and thus the NAND gate 12 is maintained in a disabled state via the inversion circuit 15. Consequently, even when an address signal Arow indicating the address ("0000") is input, there is no danger of the address agreement signal CO- (L level) being output. As a result, when the address ("0000") is set, the fuse Fa is burnt in the manner indicated above, and a voltage level L is generated from the output terminal QEa of the voltage generator VGa and the NAND gate 12 is enabled. Thus when the address signal Arow indicating the address ("0000") is input, the address agreement signal CO- is inevitably output.

Next, the operation of the fuse decoder is explained relative to the input address signal Arow. The bit A3 of the fourth column, the bit A2 of the third column, the bit A1 of the second column and the bit A0 of the first column of the address signal Arow are input into the address input terminals IN3, IN2, IN1 and IN0. The bit A3 of the fourth column is present at one of the input terminals of the fourth exclusive OR gate EX3, and an L level voltage from the output terminal QE3 of the fourth voltage generator VG3 is continually present at the other input terminal of the fourth exclusive OR gate EX3. The bit A2 of the third column is present at one of the input terminals of the third exclusive OR gate EX 2, and an H level voltage from the output terminal QE2 of the third voltage generator VG2 is continually present at the other input terminal of the third exclusive OR gate EX2. The bit A1 of the second column is present at one of the input terminals of the second exclusive OR gate EX1, and an L level voltage from the output terminal QE1 of the second voltage generator VG1 is continually present at the other input terminal of the second exclusive OR gate EX1. The bit A0 of the first column is present at one of the input terminals of the first exclusive OR gate EX0, and an H level voltage from the output terminal QE0 of the third [sic; first] voltage generator VG0 is continually present at the other input terminal of the first exclusive OR gate EX0.

Consequently, only when the address signal Arow indicates the address ("1010"), specifically, when the bit A0 of the fourth column is an H level, the bit A2 of the third column is an L level, the bit A1 of the second column is an H level and the bit A0 of the first column is an L level, will the output voltages of the exclusive OR gates EX3 to EX0 all go to H, and the output voltage of the 4-input NAND gate 10 goes to L. When the input address signal Arow does not indicate the address ("1010"), at least one of the output voltages of the exclusive OR gates EX3 to EX0 go to the L level, and the output voltage of the 4-input NAND gate 10 goes to H. When the output voltage of the 4-input NAND gate 10 goes to L, the output of the inverter 14 goes to H, and an L level address agreement signal CO- is generated by the output terminal of the NAND gate 12.

In the manner described above, when a power source is applied to the fuse decoder of this embodiment, each of the voltage generators VG0 to VG3 generates a voltage of an H or L level in accordance with the bit information of each column of the address, and specifically, whether each of the fuses F0 to F3 is burnt or not burnt, and the voltage of the specific level is generated constantly until the power source is cut. Thus, the exclusive OR gates EX0 to EX3 compare the voltage levels of the bits of each column of the input address signal Arow with each of the voltage levels from the side of the voltage generators VG0 to VG3 corresponding to each row, and when all of the columns match, the output voltage of the NAND gate 10 goes to the L level, and an L level address agreement signal CO- is generated from the NAND gate 12 of the output part.

In this embodiment of the fuse decoder, the fuses F0 to F3 not only function as passive elements for selectively allowing the current to pass on the basis of the bit information of each column of the input address signal, but also function as active elements that determine the binary logic voltage levels in accordance with each of the bits of information of the set address. Consequently, the number of fuses is the same as the number of bits in the address. Specifically, when an enable fuse Fa is added, the number increases to one more than the number of address bits, but even so, the number ends up being far smaller than the number used in conventional devices (twice the number of address bits). In the embodiment, the number of bits in the address was, for explanatory purposes, made 4, but 10 bits or more is common in actual practice, and thus the number of fuses in the embodiment would be 11 in comparison to the 20 fuses needed in conventional fuse decoders. Thus, manufacturing costs are decreased, and the yield is improved due to a halving of the number of burnt fuses. In addition, the input address signal need only be a normal address signal, and the wiring number or width can be decreased by half because a logical inversion address signal is not needed.

In addition, when the input address signal Arow is present, the logic circuit comprising the exclusive OR gates EX0 to EX3 and the NAND gate 10, etc., compares each of the voltage levels of the voltage generators VG0 to VG3 and the voltage levels for the bits of each column of the input address signal, and by this means, the decoding result is immediately output. A timing control circuit is thus not needed as with conventional devices wherein discharge and precharge were carried out by fine timing in a short cycle. In addition, because the device is constructed with a logic circuit that performs decoding by means of binary information processing, there is little danger of influences due to the manufacture process, temperature, voltage, etc.

Figure 3:
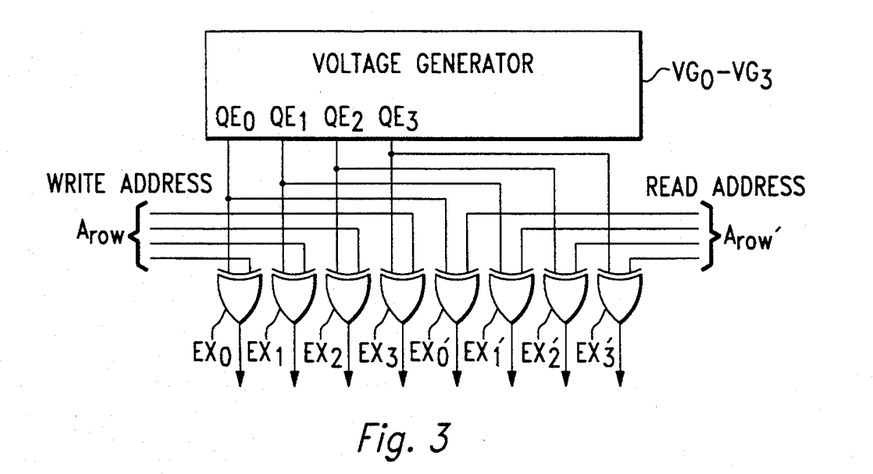
FIG. 3 is a circuit diagram, partially schematic in form, showing the circuit configuration for a case where the fuse decoder of FIG. 1 is used in an image memory.

Moreover, because the circuit is constructed such that results of decoding are immediately output by a comparison of each of the voltage levels from the voltage generators VG0 to VG3 and the voltage levels of the bits of each column of the input address signal, the decoding results can be output simultaneously even when a different memory address signal is simultaneously input. Consequently, when this embodiment of the fuse decoder is used in an image memory wherein the memory process is asynchronous between the read side and the write side, only one group of voltage generators VG0 to VG3 need be used, as shown in FIG. 3.

In the embodiment described above, although the memory address signal input into the fuse decoder was a row address signal, this need not be exclusively the case. The signal may be a column address depending on the structure of the redundant circuit, or may be an address signal that is a combination of a row address and column address. In addition, although the embodiment as described involves a decoder for salvaging defective memory cells using fuses, the present invention may also be applicable to a decoder wherein non-volatile elements other than fuses are used.

As described above, the present invention offers a decoder for salvaging defective memory cells, wherein the decoding effect is produced when voltages having binary logical levels corresponding to the bit information of each column of the address of the defective memory cells is generated by voltage generation means, and the voltage levels of the bits of each column of the input address signal are compared with the levels of the voltages corresponding to each column from the voltage generation means. By this means, a highly reliable, highly integrated decoder for salvaging defective memory cells is obtained that can be operated at high speeds.

I claim:

1. A decoder for salvaging defective memory cells comprising:
    a plurality of voltage generation circuits each comprising:
        an element which can be selectively and permanently set in response to bit information for an address of a defective memory cell wherein said voltage generation circuit generates an output signal dependent on whether said element is set or not set;
    an address corroboration circuit such that an address agreement signal is generated when said address of said defective memory cell and said output signals of said voltage generation circuits agree;
    charging means which generates a pre-charge control signal which charges said voltage generation circuits;
    discharging means which generates a discharge control signal which selectively discharges said voltage generation circuits based on the condition of said element in said node.

2. The decoder of claim 1, wherein said element is a fuse.

3. The decoder of claim 1, wherein said output signals of said voltage generation circuits are latched when said discharge control signal is no longer applied.

4. The decoder of claim 1, further comprising an additional voltage generation circuit wherein said address agreement signal is sent, when said address of said defective memory cell is 0000, only if said element of said additional voltage generation circuit is set.

5. The decoder of claim 1, wherein said address of said defective memory cell is a row address.

6. The decoder of claim 1, wherein said address of said defective memory cell is a column address.

7. The decoder of claim 1, wherein said address of said defective memory cell is a combination of a row address and a column address.

* * * * *